United States Patent [19]
Ingalls et al.

[11] Patent Number: 5,499,250
[45] Date of Patent: Mar. 12, 1996

[54] SYSTEM HAVING MULTIPLE SUBSYSTEMS AND TEST SIGNAL SOURCE RESIDENT UPON COMMON SUBSTRATE

[75] Inventors: Charles L. Ingalls; Mark R. Thomann, both of Boise, Id.

[73] Assignee: Micron Technology Inc., Boise, Id.

[21] Appl. No.: 443,818

[22] Filed: May 18, 1995

Related U.S. Application Data

[63] Continuation of Ser. No. 989,403, Dec. 11, 1992, Pat. No. 5,442,642.
[51] Int. Cl.⁶ .................................................. H04B 1/16
[52] U.S. Cl. ............................................ 371/28; 364/574
[58] Field of Search ........................... 371/22.5, 24, 27, 371/28; 364/488, 490, 491, 574

[56] References Cited

U.S. PATENT DOCUMENTS 4,701,920 10/1987 Resnick et al. .
4,914,379 4/1990 Maeno .
4,931,722 6/1990 Stoica .
5,150,047 9/1992 Saito et al. .
5,301,156 4/1994 Talley .

*Primary Examiner*—Ellis B. Ramirez
*Assistant Examiner*—Thomas Peeso
*Attorney, Agent, or Firm*—Steven P. Koda

[57] ABSTRACT

A system has multiple subsystems and a test signal source resident upon a common substrate. A first subsystem interfaces with an off-substrate functional tester during a test. The test signal source generates a first signal during the test for input to the second subsystem. The second subsystem responds performing an operation independent of operation and current state of the first subsystem. The functional tester verifies the independent operation of the first and second subsystems.

26 Claims, 3 Drawing Sheets

SYSTEM HAVING MULTIPLE SUBSYSTEMS AND TEST SIGNAL SOURCE RESIDENT UPON COMMON SUBSTRATE

This is a Continuation of application Ser. No. 989,403, filed Dec. 11, 1992, now U.S. Pat. No. 5,442,642.

FIELD OF THE INVENTION

The invention relates to testing systems formed on a substrate. Generally, the invention relates to testing subsystems of a system formed on a substrate. Tests include noise immunity and functional independence among subsystems. Particularly, in one embodiment it relates to using a test circuit formed on the same substrate as an integrated circuit being tested.

BACKGROUND OF THE INVENTION

Systems including electronic, magnetic, vibrating, and optic subsystems can be formed on a substrate. An important class of system malfunctions includes failures caused by unexpected coupling of otherwise unrelated signals. For example, in the conventional integrated circuit, unrelated signals occur simultaneously in different portions of the circuit. Circuit design and fabrication processes as well as process variations may cause circuit malfunction due to unexpected coupling of signals. A transition on one signal may couple into an otherwise unrelated signal or the state of several signals may decrease the noise immunity of an otherwise unrelated signal. Such coupling may be due to physical proximity of circuit features, unexpected simultaneous operations, unexpected variation in dimensional tolerances, and variation in fabrication steps such as mask alignment, and resolution.

Analogous failures arise in systems formed on a substrate based on magnetic, vibration, and optic principles. Currently, the most sophisticated test methods are for systems of a class including integrated circuits.

Integrated circuits are tested by applying a pattern of signals to the inputs and observing the output signals. For digital logic circuits, a lengthy binary pattern is used. Such a test pattern includes portions designed to exercise circuits that are in physical proximity to assure detection of failures related to unexpected coupling. Pattern length increases when testing many combinations of possible interactions between signals and circuit functions. As test patterns become longer, the time required to perform the test becomes longer as well.

In the typical digital integrated circuit tester, the test pattern to be applied to a device under test is organized as a list of test vectors. Each vector has at least one bit position associated with each pin on the device. Vectors may be for stimulus, for response comparison, or for a combination of both. The number of vectors associated with a pin is called the pattern depth. Conventional testers permit several hundred pins per vector and a pattern depth of several thousand states. Although these quantities seem large in the abstract, complex circuits (especially memory devices) may require many millions of vectors for a thorough test. Memory testers employ pattern generators to simplify pattern definition without sacrificing pattern sophistication.

The most sophisticated test patterns are those required for digital circuits having several complex functions that are intended to operate asynchronously to each other. Examples of such circuits include microprocessors having operation of the arithmetic logic unit independent from operation of an I/O bus management unit and video memories having operation of a low speed parallel random access port independent from a high speed serial access port. Such devices are tested efficiently on costly specialized testers.

The cost of testing is a significant portion of manufacturing costs. Digital integrated circuit testers (especially memory device testers) initially cost several millions of dollars and have significant calibration and maintenance expenses. The useful life of such a tester is limited by its design—the number of pins, pattern depth, and signal generating and comparison speeds. These and other factors limit the number of applications the tester can perform due to changes in integrated circuit packaging technology, increasing signal speeds, increasing disparity of signal speeds, and the increasing number of functions designed into a single integrated circuit package. In addition to equipment related costs, manufacturing costs include labor costs related to the duration of tests and the number of devices that can be tested simultaneously.

Tests which require many hours per test article are among the most costly. Environmental tests and burn-in tests typical of integrated circuit testing include a large number of devices under test simultaneously. Such tests may be conducted for days or weeks in which continuous electrical functional testing is desired or required. Economic and practical constraints limit pattern length and the amount of test equipment dedicated to these tests.

Reductions in test cost and improvements in test effectiveness have been made for systems other than systems formed on a substrate. When testing rack-mounted electronic systems at the subassembly (box) level and at the circuit card level, it is conventional to incorporate test circuits within the subassembly under test and circuit card under test to reduce the amount of external test equipment dedicated to the test.

Improvements to test effectiveness for digital integrated circuits have focused on synchronous testing. To achieve high test rates, integrated circuit testers synchronously use random access memory per pin in the tester and synchronously use pattern generators in the tester. It is conventional to form on substrates test circuits that monitor circuit functions and synchronously exercise circuit functions. However, such conventional techniques and monitoring circuits do not exercise circuit functions in a manner to detect failures due to asynchronous coupling of unrelated signals.

Thus, there remains a need for improving the efficiency of testing for systems formed on a substrate. The need is most visible currently for integrated circuits testing, though analogous systems have foreseeable analogous test needs. In addition, there remains a need for decreasing costs related to testing and improving the thoroughness of testing. Further improvement can be gained by employing methods of the present invention and incorporating circuits of the present invention in the design of systems formed on a substrate.

SUMMARY OF THE INVENTION

In a system formed on a substrate, the system having several functional subsystems, functional independence is difficult to test thoroughly. According to the present invention, a test circuit is added to the system and a test mode of operation is added to the timing and control functions of the system as a whole. When functional subsystems A and B of the system are to be tested for independence, subsystem A is connected to an external tester. The tester causes the system to enter the test mode of operation. When in the test mode of operation, the test circuit provides a signal derived from a signal generator formed on the same substrate as the system. The generated signal (hereinafter called GS) is coupled to subsystem B so that functional independence of subsystems A and B can be verified.

According to one aspect of the invention, interference between functional circuits can be tested without use of an external oscillator. According to another aspect of the invention, the system need not provide an external oscillator interface.

According to another aspect of the invention, the layout of the test circuit and the characteristics of the GS signal are selected to test the noise immunity of the several functional subsystems of the system. Various signal characteristics can be selected to test a simulated worst case; an important functional independence; and performance in a simulated noisy environment where resolution, accuracy, timing, or similar specifications are to be assured.

According to yet another aspect of the invention, the effectiveness of system testers can be extended. When the system to be tested is an integrated circuit, the integrated circuit tester is relieved of the task of generating the GS signal and more sophisticated test patterns can be achieved. Consequently, an important economic benefit is realized because conventional testers can be used to test new devices and patterns of decreased length can be used.

According to still another aspect of the invention, continuous testing can be accomplished more effectively. When in the test mode of operation, testing related to the GS signal is continuous. For example, when the system is an integrated circuit, some applications of the integrated circuit in a subassembly may employ means to enter test mode as a method for subassembly diagnostics. During tests that span long periods of time, for example burn-in tests, use of the test mode of the present invention will result in more thorough tests with less dependence upon dedicated test equipment.

These and other aspects, advantages, and features of the present invention will become apparent by reference to the following description of the invention in conjunction with the referenced drawing figures.

DETAILED DESCRIPTION OF THE INVENTION

Figure 1:
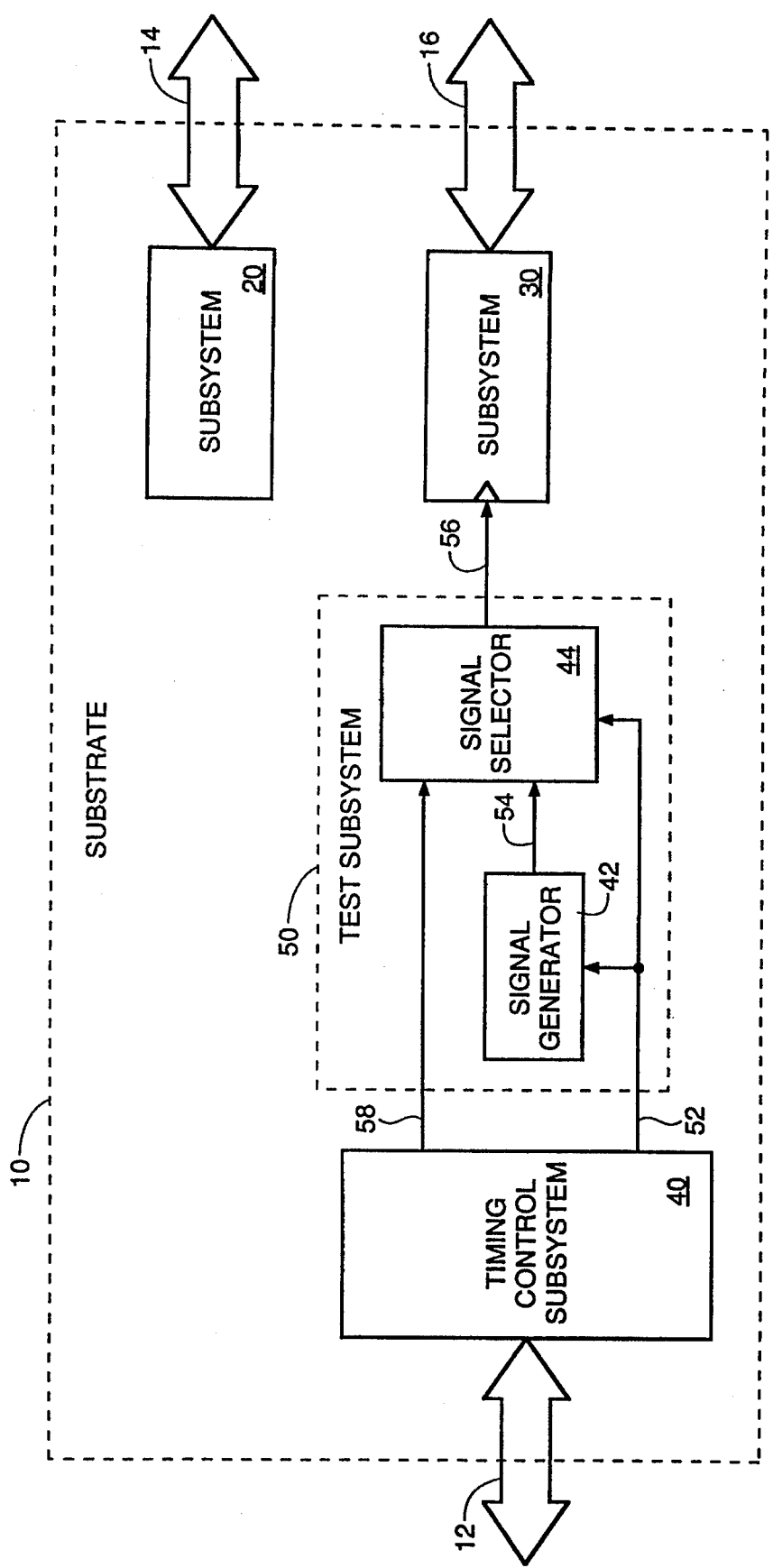
FIG. 1 is a block diagram of a system formed on a substrate.

FIG. 1 is a block diagram of substrate 10 used to illustrate an embodiment of the present invention. Substrate 10 includes subsystem 20, subsystem 30, timing and control circuit 40 and test circuit 50. Subsystems 20 and 30 respond to inputs and generate outputs collectively indicated by interfaces 14 and 16, respectively. Control and status signals generated and sensed by timing and control circuit 40 are collectively indicated by interface 12.

Substrate 10 is functionally divided into subsystem 20 and subsystem 30 which are designed to operated simultaneously with little or no coupling or interaction between them. Although the design may include functions performed by subsystem 20 and subsystem 30 in cooperation, the design is characterized by at least one function performed primarily by subsystem 20 in a manner expected to be independent of the operation or current state of subsystem 30.

Timing and control subsystem 40 generates signal 58. Signal 58 connects to test subsystem 50. Test subsystem 50 includes a signal generator 42 and signal selector 44. Signal 58 connects to one of two data inputs of signal selector 44. Signal generator 42 provides generated signal 54 which connects to the second data input of signal selector 44. Test mode signal 52 connects to the control input of signal selector 44. In one embodiment test mode signal 52 connects to signal generator 42 to control signal generation. In another embodiment (not shown) test mode signal 52 does not connect to signal generator 42 and signal generator 42 is independent of test mode signal 52. Test mode signal 52 may be input to substrate 10 as part of interface 12 or may be generated from inputs of interface 12 by timing and control subsystem 40.

Substrate 10 has at least two modes of operation. In the normal mode of operation, test mode signal 52 is not asserted and signal 58 is coupled to subsystem 30 via signal 56. When the functions of subsystem 20 are to be tested for independence from the functions of subsystem 30, test mode signal 52 is asserted and substrate 10 enters the test mode of operation. During test mode, generated signal 54 is coupled to subsystem 30 via signal 56.

Testing of substrate 10, according to the present invention, will be described for the case when interfaces 12, 14, and 16 are integrated circuit interfaces. In this case, an integrated circuit tester having pattern generation and comparison capability is programmed to interact with the functions of the integrated circuit. Then, interfaces 12, 14, and (depending on test objectives) 16 are connected to the tester and the test program is performed, i.e. the programmed pattern of test vectors is applied and sensed at a programmed rate called the test vector rate.

A series of test vectors is used to enable timing and control subsystem 40 to assert test mode signal 52. Additional test vectors may be used before and after test mode signal 52 is asserted. For example, test vectors may be required to establish in subsystem 30 signal feedback loops, test conditions, functional test sequences, and the like.

In test mode, functions of subsystem 30 are tested at the rate corresponding to the frequency of signal generator 42 while functions of subsystem 20 are exercised at the test vector rate. The fact that subsystem 30 is exercised at a rate different from the test vector rate allows more comprehensive testing of subsystem 20. For example, subsystem 20 may be tested while subsystem 30 is operating at a worst case frequency or in a manner asynchronous to the operation of subsystem 20. The frequency of signal generator 42 may be selected to simulate operation of substrate 10 in a worst case circuit application. Furthermore, if the frequency of signal generator 42 is higher than the test vector rate, then a more sophisticated test pattern can be used to test subsystem 20. This later benefit results from the fact that when signal generator 42 provides signal 56, signal 58 is not required to be represented by test vectors; hence, more vectors will be available for testing combinations of functions of subsystem 20. In this way, use of test subsystem 50 increases assurance that the functions of subsystem 20 perform properly regardless of the operation and state of subsystem 30.

Figure 2:
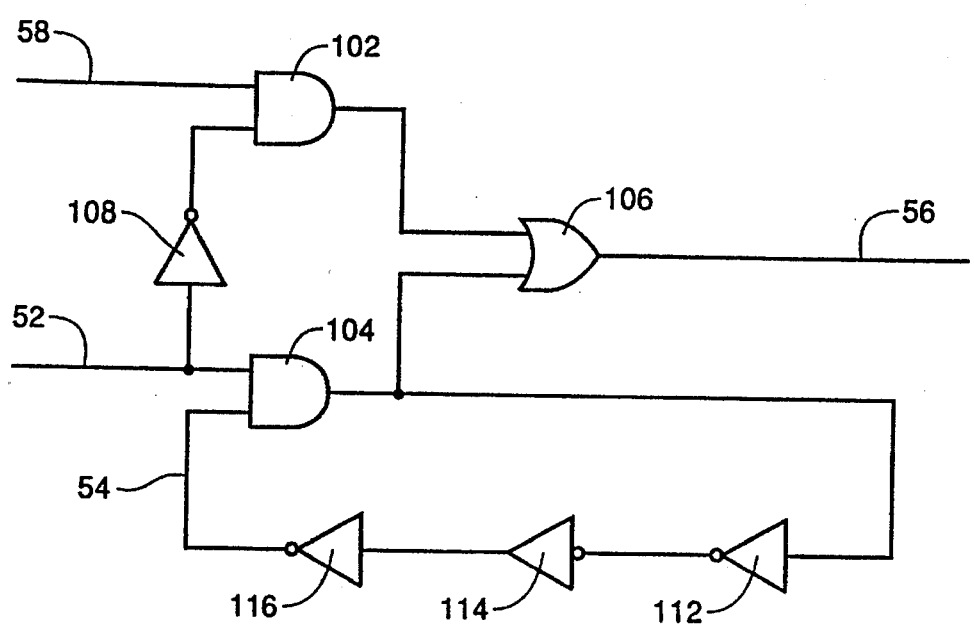
FIG. 2 is a schematic diagram of test subsystem 50 in one embodiment.

FIG. 2 is a schematic diagram of test subsystem 50 in one embodiment wherein substrate 10 is at least in part an integrated circuit. Gates 102–108 implement signal selector 44. Signal generator 42 is formed by gates 104 and inverters 112–116. When in normal mode, gate 102 couples signal 58 to signal 56. In test mode, gate 104 couples generated signal 54 to signal 56. Because signal 58 is blocked by gate 102, signal 58 may continue to toggle or remain at either logic state. In this embodiment, signal generator 42 is gated by test mode signal 52 so that it does not oscillate while in normal mode and an important benefit is realized.

Since generated signal 54 remains in one logic state during normal mode, physical proximity of signal generator interconnections to portions of subsystem 20 have little effect during normal mode. Therefore, the layout of gate 104, inverters 112–116, feedback interconnections, and the connection between gate 104 and 106 can be arranged physically on the integrated circuit to promote worst case coupling in test mode of generated signal 54 (and signals related to generated signal 54) with sensitive portions of subsystem 20. Thus, the required noise margin of subsystem 20 can be assured by test in the test mode.

Figure 3:
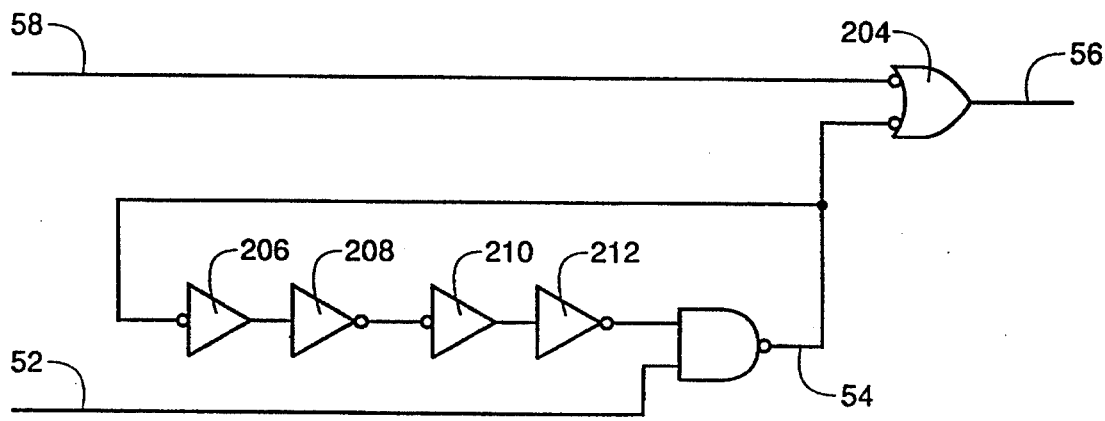
FIG. 3 is a schematic diagram of test subsystem 50 in another embodiment.

FIG. 3 is a schematic diagram of test circuit 50, in an embodiment employing less circuitry than the embodiment of FIG. 2. When test mode signal 52 is asserted, the output of gate 214 provides generated signal 54 in response to feedback through inverters 206–212 to a second input of gate 214. When in normal mode, gate 204 couples signal 58 to signal 56. In test mode, gate 204 couples generated signal 54 to signal 56 and signal 58 is inactive (high) as defined by timing and control subsystem 40. In one application, signal 58 remains in the high state as defined by the integrated circuit tester coupled during test to interface 12.

Figure 4:
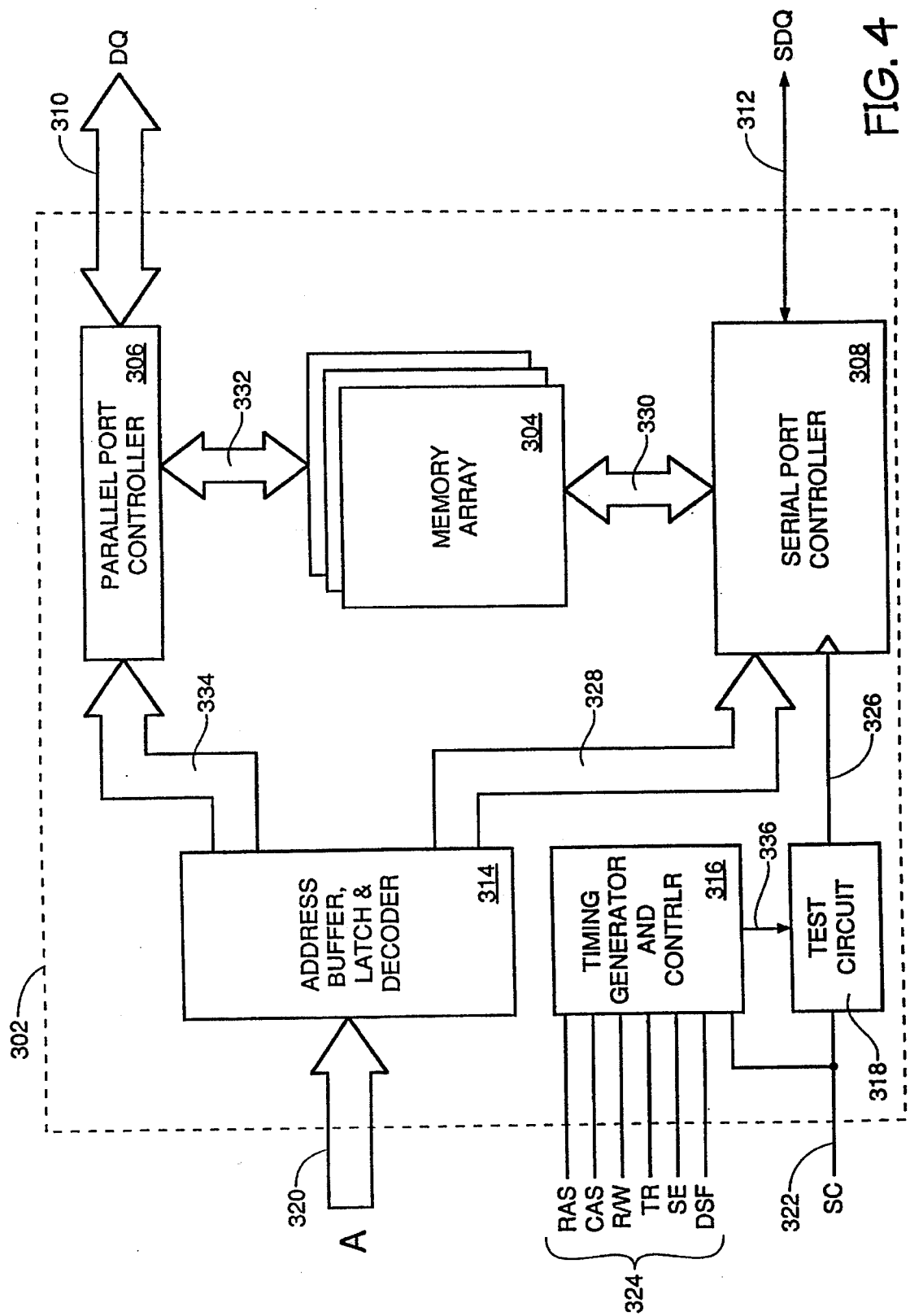
FIG. 4 is a block diagram of a video random access memory device employing a test circuit of the present invention.

FIG. 4 is a block diagram of a video random access memory (VRAM) implemented as an integrated circuit employing a test circuit of the present invention. VRAM 302 is an example of a system formed on a substrate. VRAM 302 is a multiport memory device having a parallel port 310 and a serial port 312. Each port has access to memory array 304. VRAM 302 is designed to permit access by address bus 320 and column and row decode signals 334 via parallel port controller 306 at a rate perhaps an order of magnitude slower than the rate of access provided by serial port controller 308. Serial port controller 308 is responsive to high speed serial clock (SC) 322. In a normal mode of operation, SC is coupled through test circuit 318 to clock signal 326 which connects to serial port controller 308. However, a combination of timing signals 324 causes VRAM 302 to enter a test mode of operation. In test mode, test mode signal 336 is asserted by timing generator and controller 316 and consequently, test circuit 318 generates clock signal 326. Test circuit 318 is implemented according to FIG. 2 or 3 where signal 58 corresponds to SC, test mode signal 52 corresponds to test mode signal 336, and signal 56 corresponds to clock signal 326.

There are several alternate embodiments of the present invention. It is not necessary that the signal generated by the test circuit be a clock signal per se. Any signal that exacerbates undesirable coupling of signals may be generated. The following signals, though not generally considered clock signals, are the functional equivalent of the clock signal for purposes of the present invention: a white noise signal, a signal having a transition at a critical time, a signal having a burst of transitions at a random interval, a signal having frequency components which vary, and a signal which causes a load on a common circuit such as a power supply.

In another embodiment, the test subsystem is located in proximity to one of two similar subsystems. In test mode, the performance of the two similar subsystems can be compared to assure that the similar subsystems operate properly and independently of the effect of test subsystem signals. In this way, balanced subsystems and matched subsystems can be tested.

In yet another important class of embodiments, the test subsystem and test mode control circuitry are used to test several systems on a common substrate. In the case where the substrate is an integrated circuit, a plurality of identical integrated circuits are conventionally formed simultaneously on a single substrate or wafer. Integrated circuit testing is conventionally performed before and after the substrate is divided into die having one integrated circuit each. Tests prior to division are called probe tests or wafer tests. Without departing from the spirit of the present invention, it is practical to form a test circuit on the substrate and couple it to more than one integrated circuit for probe tests. With this approach, less substrate surface would be dedicated to test functions than when one test circuit is implemented for each integrated circuit formed on the same substrate.

Throughout this specification and in the claims which follow, the meaning of the words "system" and "subsystem" include electrical, optical, magnetic, and vibration systems and subsystems.

While for the sake of clarity and ease of description, several specific embodiments of the invention have been described; the scope of the invention is intended to be measured by the claims as set forth below. Other embodiments of the invention will be apparent in light of the disclosure to one of ordinary skill in the arts to which the invention applies.

What is claimed is:

1. A system formed on a substrate, the system interfacing with an off-substrate functional tester during a first test, the system comprising:

a first subsystem which interfaces to the functional tester during the first test;

a second subsystem for performing, during the first test, an operation independent of operation and current state of the first subsystem;

a test signal source which generates a first signal during the first test, of the first and second subsystems only the second subsystem receiving the first signal during the first test; and wherein the first subsystem, second subsystem and test signal source are resident to the substrate.

2. The system of claim 1, in which the first test comprises at least one of: (i) a test of the functional independence of the first and second subsystems; (ii) a test of noise immunity between the first and second subsystems; and (iii) a test of signal interference between second signals occurring at the first subsystem and third signals occurring at the second subsystem.

3. The system of claim 1, in which the first subsystem comprises a first integrated circuit and the second subsystem comprises a second integrated circuit, and in which the first test occurs prior to dividing the substrate into a plurality of substrate dies, in which a resulting first die comprises the first integrated circuit and a resulting second die comprises the second integrated circuit.

4. The system of claim 1, in which the first subsystem comprises at least one of an electrical, optical, magnetic or vibration subsystem; and in which the second subsystem comprises at least one of an electrical, optical, magnetic or vibration subsystem.

5. The system of claim 1, in which the first signal comprises at least one of (i) a periodic signal, (ii) a white noise signal, (iii) a signal having a state transition at a desired time, (iv) a signal having a burst of transitions at a random interval, (v) a signal having varying frequency components, and (vi) a signal which causes a load on a circuit coupled to both the first subsystem and second subsystem.

6. The system of claim 1, in which the test signal source and the first subsystem are physically arranged on the substrate to promote an approximate worst-case coupling between a second signal occurring in the first subsystem during the first test and the first signal.

7. The system of claim 1, in which the first subsystem receives a test signal from the functional tester during the first test, the first signal having a frequency which differs from a frequency of the test signal.

8. The system of claim 7, in which the first signal is asynchronous to said test signal.

9. The system of claim 1, further comprising a timing and control subsystem which generates a third signal, the second subsystem receiving one of the first signal and the third signal, the second subsystem receiving the first signal during testing, the second subsystem receiving the third signal during normal operation.

10. The system of claim 9, in which the timing and control system receives a fourth signal from the functional tester during the first test; in response to the fourth signal the timing and control subsystem generating a fifth signal; the test signal source receiving the fifth signal and in response generating the first signal, the first signal being output to the second subsystem.

11. The system of claim 10 serving as a video random-access memory, the system further comprising a memory array on the substrate; and in which the first subsystem is a parallel port controller, the second subsystem is a serial port controller, the first signal is a substrate-resident test signal, the third signal is a clock signal, and the fourth signal is a test vector.

12. The system of claim 9, in which the timing and control system receives a fourth signal from the functional tester during the first test, and in response to the fourth signal the timing and control subsystem generating a fifth signal; and further comprising a signal selector circuit receiving the first signal, third signal and fifth signal, the signal selector circuit coupling the first signal to the second subsystem in the presence of an active fifth signal and otherwise coupling the third signal to the second subsystem.

13. An integrated circuit which interfaces with an off-chip integrated circuit tester during a first test, comprising:

a first circuit which receives a test signal from the integrated circuit tester during the first test;

a second circuit for performing, during the first test, an operation independent of operation and current state of the first circuit;

a test signal source which generates a first signal during the first test, of the first and second circuits only the second circuit receiving the first signal during the first test; and wherein the first circuit, second circuit and test signal source reside on a common substrate.

14. The integrated circuit of claim 13, in which the first signal is asynchronous to said test signal.

15. The integrated circuit of claim 14, further comprising a timing circuit which generates a clock signal, the second circuit receiving one of the first signal and the clock signal, the second circuit receiving the first signal during testing, the second circuit receiving the clock signal during normal operation.

16. The integrated circuit of claim 15, in which the timing circuit receives a test vector signal from the off-chip integrated circuit tester during the first test; the timing circuit generating a test mode signal in response to the test vector signal; the test signal source receiving the test mode signal and in response generating the first signal, the first signal being output to the second circuit.

17. The integrated circuit of claim 15, in which the timing circuit receives a test vector signal from the off-chip integrated circuit tester during the first test, the timing circuit generating a test mode signal in response to the test vector signal; and further comprising a signal selector circuit receiving the first signal, clock signal and test mode signal, the signal selector circuit coupling the first signal to the second circuit in the presence of an active test mode signal and otherwise coupling the clock signal to the second circuit.

18. The integrated circuit of claim 14, in which the first signal comprises at least one of (i) a periodic signal, (ii) a white noise signal, (iii) a signal having a state transition at a desired time, (iv) a signal having a burst of transitions at a random interval, (v) a signal having varying frequency components, and (vi) a signal which causes a load on a circuit coupled to both the first circuit and second circuit.

19. The integrated circuit of claim 18, in which the first test comprises at least one of: (i) a test of the functional independence of the first and second circuits; (ii) a test of noise immunity between the first and second circuits; and (iii) a test of signal interference between second signals occurring at the first circuit and third signals occurring at the second circuit.

20. A method of testing first and second subsystems residing on a common substrate, comprising the steps of:

inputting to the first subsystem during a first test, a test signal from an off-substrate functional tester;

generating a first signal at a test signal source located on the substrate;

coupling the first signal to the second subsystem during the first test;

measuring response of the first subsystem to the test signal and response of the second subsystem to the first signal, the second subsystem for performing an operation independent of operation and current state of the first subsystem.

21. The method of claim 20, further comprising at least one of the following steps:

(i) evaluating functional independence of the first and second subsystems from the respective measured responses of the first and second subsystems;

(ii) evaluating noise immunity between the first and second subsystems from the respective measured responses of the first and second subsystems; and (iii) determining whether interference is present between second signals generated by the first subsystem and third signals generated at the second subsystem based upon the measured responses of the first and second subsystems.

22. The method of claim 20, in which the first signal comprises at least one of (i) a periodic signal, (ii) a white noise signal, (iii) a signal having a state transition at a desired time, (iv) a signal having a burst of transitions at a random interval, (v) a signal having varying frequency components, and (vi) a signal which causes a load on a circuit coupled to both the first subsystem and second subsystem.

23. The method of claim 20, in which the first signal is asynchronous to said test signal.

24. The method of claim 23, further comprising the steps of:
   inputting a test vector signal from the off-substrate functional tester to a timing circuit located on the substrate;
   generating at the timing circuit a test mode signal in response to the test vector signal; and
   wherein said step of coupling occurs in response to the test mode signal.

25. The method of claim 24, in which the step of generating the first signal also occurs in response to said test mode signal.

26. The method of claim 23, further comprising at least one of the following steps:
   (i) evaluating functional independence of the first and second subsystems from the respective measured responses of the first and second subsystems;
   (ii) evaluating noise immunity between the first and second subsystems from the respective measured responses of the first and second subsystems; and
   (iii) determining whether interference is present between second signals generated by the first subsystem and third signals generated at the second subsystem based upon the measured responses of the first and second subsystems.

* * * * *

UNITED STATES PATENT AND TRADEMARK OFFICE
CERTIFICATE OF CORRECTION

PATENT NO.    : 5,499,250
DATED         : March 12, 1996
INVENTOR(S)   : Charles L. Ingalls and Mark R. Thomann It is certified that error appears in the above-identified patent and that said Letters Patent is hereby corrected as shown below:

Drawings,
Figure 3, insert numeral -- 214 -- to the appropriate gate location
Please replace FIG. 3 with the following:

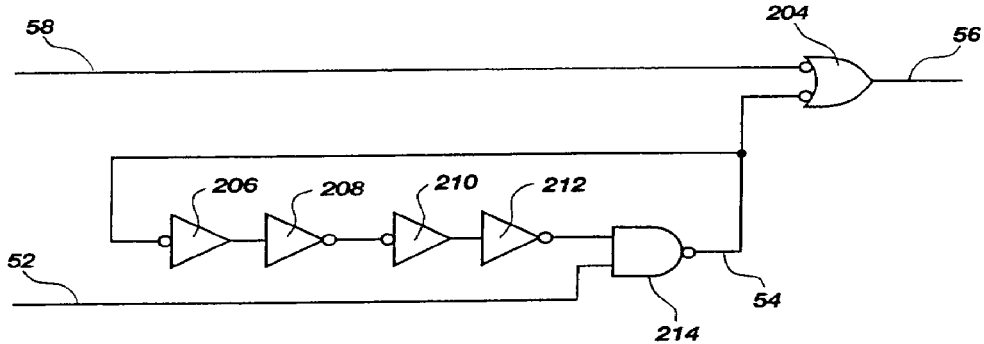

FIG. 3

Column 1,
Line 15, change "as an" to -- with the --
Line 28, after "transition" change "on" to -- of --
Line 35, delete the comma after "alignment"

Column 3,
Line 48, change "substrate." to -- substrate, connected to a conventional integrated circuit tester. --
Line 63, change "circuit 50" to -- subsystem 50 --

Column 5,
Line 26, change "circuit 50" to -- subsystem 50 --

Column 6,
Line 56, before "second" insert -- the --

Column 7,
Line 12, before "second" insert -- the --

Column 8,
Line 33, before "second" insert -- the --

UNITED STATES PATENT AND TRADEMARK OFFICE
CERTIFICATE OF CORRECTION

PATENT NO. : 5,499,250
DATED : March 12, 1996
INVENTOR(S) : Charles L. Ingalls and Mark R. Thomann It is certified that error appears in the above-identified patent and that said Letters Patent is hereby corrected as shown below:

<u>Column 9,</u>
Line 7, before "second" insert -- the --

Signed and Sealed this

Sixteenth Day of December, 2003

JAMES E. ROGAN
*Director of the United States Patent and Trademark Office*